United States Patent [19]

Ruckman et al.

[11] Patent Number: 5,264,394
[45] Date of Patent: Nov. 23, 1993

[54] METHOD FOR PRODUCING HIGH QUALITY OXIDE FILMS ON SUBSTRATES

[75] Inventors: Mark W. Ruckman, Middle Island; Myron Strongin, Center Moriches; Yong L. Gao, Henrietta, all of N.Y.

[73] Assignee: Associated Universities, Inc., Washington, D.C.

[21] Appl. No.: 704,097

[22] Filed: May 22, 1991

[51] Int. Cl.$^5$ ......................................... H01L 21/302
[52] U.S. Cl. .............................. 437/225; 427/126.3; 427/126.4; 427/294; 427/301; 427/419.2; 148/DIG. 118; 148/DIG. 25
[58] Field of Search .................... 148/33.3, DIG. 116, 148/DIG. 117, DIG. 118, DIG. 169, DIG. 25; 427/126.3, 126.4, 294, 301, 419.2; 437/61, 62, 225, 946

[56] References Cited

U.S. PATENT DOCUMENTS

| | | | |
|---|---|---|---|
| 3,139,362 | 6/1964 | D'Asaro et al. | 148/187 |
| 3,306,768 | 2/1967 | Peterson | 117/106 |
| 4,002,542 | 1/1977 | Young | 204/38 |
| 4,002,545 | 1/1977 | Fehiner et al. | 204/192 |
| 4,038,167 | 7/1977 | Young | 204/192 |
| 4,371,587 | 2/1983 | Peters | 428/446 |
| 4,474,829 | 10/1984 | Peters | 427/53.1 |
| 4,592,927 | 6/1986 | Stall | 427/126.3 |
| 4,686,112 | 8/1987 | Hoffman | 427/419.2 |
| 4,770,901 | 9/1988 | Katoh et al. | 427/126.3 |
| 4,888,203 | 12/1989 | Rothschild et al. | 427/126.4 |
| 5,035,923 | 7/1991 | Sarin | 427/419.2 |

FOREIGN PATENT DOCUMENTS

| | | | |
|---|---|---|---|
| 53-015273 | 2/1978 | Japan | 427/126.4 |
| 55-104328 | 8/1980 | Japan | 427/126.3 |
| 909299 | 10/1962 | United Kingdom | 427/126.3 |

OTHER PUBLICATIONS

Landgren et al., "The Oxidation of GaAs(110): A Reevaluation", J. Vac. Sci. Technol., B2(3), Jul.-Sep. 1984, pp. 351-358.
Waddill, et al., "Cluster Deposition on GaAs(110): Formation of Abrupt, Detect-Free Interfaces", Physical Review Letters, vol. 62, No. 13, Mar. 27, 1989, pp. 1568-1571.
Oshima et al., "Combined Surface Analysis By Synchrotron Radiation Photoemission Spectroscopy and Surface Extended X-Ray Absorption Fine Structure of Oxidation Features of Metal-Deposited GaAs", J. Vac. Sci. Technol., A 6(3), May/Jun. 1988, pp. 1451-1455.
A. Zunger, "Al On GaAs(110) Interface: Possibility of Adatom Cluster Formation", Physical Review B, vol. 24, No. 8, Oct. 15, 1981, pp. 4372-4391.
Frankel et al., "UV Photoemission Study of Low Temperature Oxygen Adsorption on GaAs(110)$^a$", J. Vac. Sci. Technol. B, vol. 1, No. 3, Jul.-Sep. 1983, pp. 763-766.
Gao, et al., "Growth of Al Oxide Layers on GaAs(100) By Reaction with Condensed Molecular Oxygen", J. Appl. Phys., 67(11), Jun. 1, 1990, 7148-7150.
Qiu et al., "Photoemission Studies of the Interaction of Li and Solid Molecular Oxygen", Physical Review B, vol. 39, No. 9, Mar. 15, 1989, pp. 6194-6197.
Qiu, et al., "The Formation of Metal-Oxygen Species at Low Temperatures", J. Vac. Sci. Technol., vol. A8, p. 2595, 1990.

(List continued on next page.)

Primary Examiner—George Fourson
Attorney, Agent, or Firm—Margaret C. Bogosian

[57] ABSTRACT

A method for providing an oxide film of a material on the surface of a substrate using a reactive deposition of the material onto the substrate surface in the presence of a solid or liquid layer of an oxidizing gas. The oxidizing gas is provided on the substrate surface in an amount sufficient to dissipate the latent heat of condensation occurring during deposition as well as creating a favorable oxidizing environment for the material.

10 Claims, 4 Drawing Sheets

OTHER PUBLICATIONS

Frankel, et al., "Adsorption of $O_2$ and CO on Cleaved GaAs (11) At Low Temperatures[a]", J. Vac. Sci. Technol., A 1(2), Apr.-Jun. 1983, pp. 679-683.

Wilmsen, et al., "Initial Oxidation and Oxide/Semiconductor Interface Formation on GaAs", J. Vac. Sci. Technol., 16(5), Sep./Oct. 1979, pp. 1434-1438.

Skeath, et al., "Comparative Studies of Oxygen Adsorption on GaAs (11) Surfaces with Ultrathin Aluminum and Cesium Overlayers", J. Vac. Sci. Technol., vol. 16, No. 5, Sep./Oct. 1979, pp. 1439-1442.

Grunthaner et al., "Local Atomic and Electronic Structure of Oxide/GaAs and $SiO_2$/Si Interfaces Using High-Resolution XPS[a]", J. Vac. Sci. Technol., 16(5), Sep./Oct. 1979, pp. 1443-1453.

J. C. Phillips, "Directions of Solid State Materials Research", in Frontier Topics and Future Research Directions of Research in Materials Science and Engineering, Proc. of the Centennial Symposium, Oct. 17-18, 1983, eds. H. Steinfink, H. L. Marcus, and R. N. Walser, Univ. of Texas at Austin, Tex. 1984.

METHOD FOR PRODUCING HIGH QUALITY OXIDE FILMS ON SUBSTRATES

This invention was made with Government support under contract number DE-AC02-76CH00016, between the U.S. Department of Energy and Associated Universities, Inc. The Government has certain rights in the invention.

The present invention involves a method for growing oxide layers of a material on the surface of a substrate. In particular, the present invention involves a method of growing metal oxides on the surface of compound semiconductors.

BACKGROUND OF THE INVENTION

It is frequently necessary to form a dielectric layer on the surface of a semiconductor to function as an insulating layer or a protective barrier. A common approach to forming such a dielectric involves growing or depositing an oxide layer of some material on the semiconductor surface. Typically, the material is a metal or the semiconducting material itself and the resulting dielectric layer is the corresponding oxide of the material.

In one approach known to the prior art, oxide layers can be formed utilizing the material in the semiconductor itself. These layers are often referred to as "native" oxide layers. In this approach, the oxidation of the semiconductor surface by an oxidizing gas forms the resulting oxide layer. This approach produces favorable results when silicon is involved due to its propensity to form a stable, high quality oxide ($SiO_2$). However, compound semiconductors composed of two or more of the elements found in Groups IIB, IIIA, IVA, VA and VIA of the Periodic Table are less favorable candidates for such an approach. Compound semiconductors are characterized as having large electron mobilities as well as a range of band gaps that account for their desirable properties as semiconductors. However, compound semiconductors often do not oxidize uniformly or form stable, native oxides.

For example, even though a material such as gallium arsenide is an excellent semiconductor, it is a poor candidate for native oxide formation. The current protocol for inducing native oxide formation on GaAs involves inducing the oxidation of the GaAs in the presence of $As_2O_3$ and oxygen. Under such an approach, the resulting oxide layer contains a high number of defects.

Defects occur when the resulting oxide layer is non-uniformly formed. Such defects lead to high surface state densities at the semiconductor/oxide layer interface. These high surface densities trap electrons when a voltage is applied to the semiconductor. This results in concentrations of electrons near the interface which interferes with reproducibility in conductivity. Consequently, undesirable fluctuations in current are produced when a voltage is applied to the semiconductor.

As a result of the foregoing problems in forming native oxide layers on compound semiconductors such as GaAs, other approaches for depositing foreign metal oxides on the surfaces of compound semiconductors have been attempted.

One conventional technique, known in the art as non-reactive sputtering, involves the bombardment of a target material composed of a selected oxide material, such as $SiO_2$. As the target material is bombarded under a vacuum, the oxide material is physically removed from the target material and is subsequently deposited on the surface of the semiconductor.

Another technique is a plasma-enhanced chemical vapor deposition process wherein vapor phase reactant gases are subjected to radiation, creating an ionized plasma. The ionized reactants subsequently interact to form the desired reaction product which is ultimately deposited on the substrate surface.

A shortcoming of both of the aforementioned approaches is that there is a bombardment of the semiconductor surface by either electrons, ions or the oxide molecules being deposited. This bombardment damages the substrate and results in a high number of defects at the semiconductor/oxide layer interface when attempting to form a metal oxide layer on the surface of compound semiconductors such as GaAs.

Another approach, disclosed in U.S. Pat. No. 4,371,587 to Peters, involves photochemical vapor deposition of the desired oxide material at room temperature. In particular, the Peters reference involves the photochemical generation of neutral oxygen atoms by exposing a non-reactive, oxygen-containing gas to collisions with atoms of mercury vapor that have undergone photochemical excitation. The resulting neutral oxygen atoms are reacted with a compatible vapor phase reactant gas to produce the desired oxide vapor, which subsequently undergoes vapor deposition on the semiconductor surface.

A major shortcoming of the vapor deposition approach previously mentioned is that as the oxide molecules are deposited as a vapor, they have an inherent kinetic energy which is a function of their mass and velocity. When a particle having a kinetic energy is deposited on a surface, kinetic energy is transferred to the receiving surface in the form of heat energy, known as the latent heat of condensation. If this latent heat of condensation is not properly dissipated, it can promote what is known as an exchange reaction at the interface between the oxide layer being deposited and the underlying semiconductor surface.

In an exchange reaction, the latent heat of condensation disrupts the bonds occurring between the atoms which make up individual molecules of the semiconducting substance. This phenomenon typically occurs at the surface where the oxide layer is being deposited. Once these bonds have been broken, the individual atoms present in the semiconductor surface are free to form new bonds. As a result, some of the atoms recombine with atoms in the oxide layer, forming the undesirable defects discussed previously.

As a result, prior art methods which do not adequately address the dissipation of the latent heat of condensation fail to produce a high quality metal oxide layer having a reduced incidence of defects at the dielectric/semiconductor interface.

Furthermore, it is known that inert gases can be retained on the surface of a substrate to buffer the latent heat of condensation which occurs as a result of kinetic energy inherent in particles being deposited on the substrate surface. However, experimental data has suggested that reactive gases, especially those containing oxygen, are undesirable buffers for dissipating the latent heat of condensation because they promote oxidation of the underlying substrate and result in exchange reactions that impair the quality of the dielectric layer. Indeed, the difficulties in using a reactive oxidizing gas are readily apparent in the protocol for creating native oxides of GaAs. Typically, the oxidation of the underlying substrate is difficult to control, despite the fact that oxygen is present predominantly in a gaseous phase rather than being concentrated on the substrate surface as in the present invention.

It is therefore an object of the present invention to provide a new and improved method for depositing an oxide film of a material on a substrate surface by reactive deposition of the material onto the surface in the presence of a solid or liquid layer of an oxidizing gas.

It is also an object of the present invention to provide a high quality metal oxide layer on the surface of a sensitive semiconductor substance, minimizing the incidence of defects at the oxide-semiconductor interface caused by chemical reactions associated with the latent heat of condensation during deposition as well as creating a favorable oxidation environment for reactive deposition.

SUMMARY OF THE INVENTION

The present invention is a new method for providing an oxide film of a material on the surface of a substrate. The method includes providing a liquid or solid layer of an oxidizing gas on the substrate surface in an amount sufficient to promote formation of an oxide of the material on the substrate. After the layer of oxidizing gas is present on the substrate surface, the material is subsequently reactively deposited onto the substrate. Reactive deposition involves depositing a material onto a receiving matrix wherein the material being deposited undergoes a chemical reaction with some substance to formulate a new species at the site of deposition. In the method of the present invention, the deposited material reacts with the oxidizing gas present on the substrate surface to form the corresponding oxide of the material.

In one embodiment of the method of the present invention, the substrate is preferably a semiconducting substance and the deposited material is an elemental metal. More preferably, the deposited material is either titanium, tungsten, aluminum or zirconium and the substrate is a compound semiconductor composed of elements selected from the group consisting of periodic Groups IIB, IIIA, IVA, VA and VIA. Most preferably, the substrate is gallium arsenide and the deposited material is aluminum. The oxidizing gas is preferably molecular oxygen. The step which provides for the layer of oxidizing gas on the substrate surface is preferably accomplished under a vacuum of $\leq 10^{-9}$ Torr and a temperature of $\leq 49°$ K.

One advantage of the method of the present invention is that it produces an oxide layer that is relatively stable. Another advantage of the method of the present invention is that the resulting oxide layer is of a high purity and the substrate/oxide layer interface is free from undesirable chemical defects. For example, the condensation of the oxidizing gas on the substrate surface does not cause appreciable oxidation of the substrate and a stable oxide of the desired material forms upon deposition of that material. The oxidizing gas also suppresses the substitutional interface which typically occur when the material is deposited directly upon the substrate surface.

For a better understanding of the present invention, together with other and further objects, reference is made to the following description, taken together with the accompanying drawings, the scope of which will be pointed out in the appended claims.

DETAILED DESCRIPTION OF THE PREFERRED EMBODIMENTS

Figure 1:
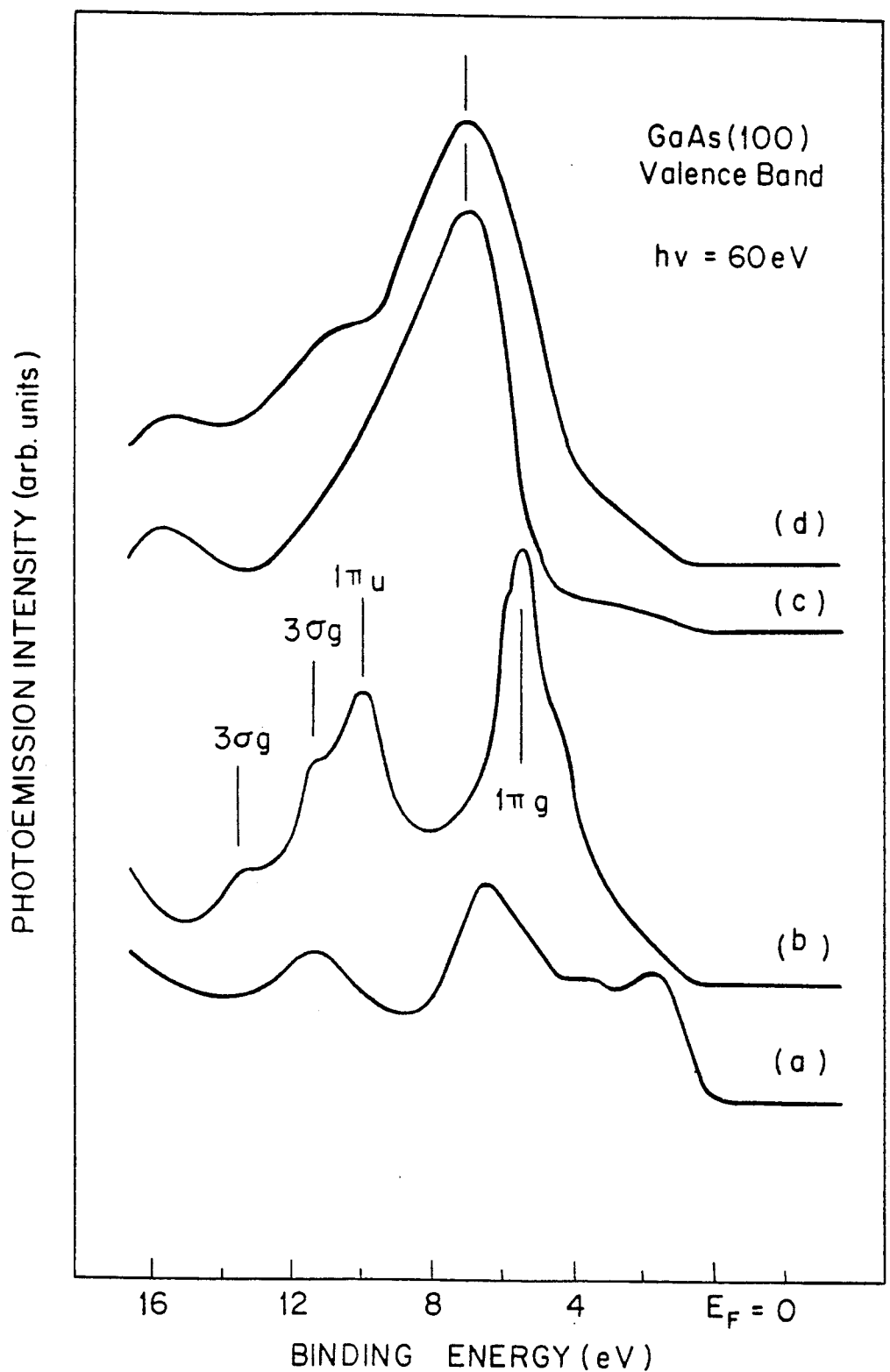
FIG. 1 shows various valence band energy distribution curves corresponding with the formation of aluminum oxide on a GaAs (100) surface under various conditions.

In the preferred embodiment of the present invention, a compound semiconductor such as gallium arsenide (GaAs) is used as a substrate upon which a layer of a foreign metal oxide, such as aluminum oxide is formed. The process involves condensing a layer of an oxidizing gas, such as molecular oxygen, on the surface of the semiconductor. For example, one approach known in the art as cryosorption, involves maintaining the substrate under a vacuum at very low temperatures, thereby providing an effective retention of the gas on the substrate surface.

It is known in the art that various compound semiconductors can be formed by combining elements present in Groups IIB, IIIA, IVA, VA and VIA of the Periodic Table. The method of the present invention utilizes gallium arsenide by way of example, however, a variety of other compounds such as InP and HgCdTe are examples of suitable candidates for a compound semiconductors substrate.

The oxide layer of the method of the present invention is composed of the corresponding oxide of the material which is deposited upon the substrate surface. Typically, this material will be either a simple metal, transition metal or an alkali metal. Examples of suitable candidates would be aluminum, tungsten, zirconium and titanium. The method the present invention utilizes aluminum, by way of example, to form its corresponding oxide.

In the preferred embodiment of the method of the present invention, the temperature of the substrate and the gas being condensed on its surface are maintained $\leq 49°$ K. in order to retain the gas on the surface of the substrate and to minimize undesirable exchange reactions occurring between the underlying semiconductor substrate and the oxide layer being formed upon it. Generally, the lower the temperature of the gas and the substrate, the more readily the latent heat of condensation will be dissipated, thereby avoiding undesirable exchange reactions induced by the disruption of the chemical bonds within individual molecules of the semiconductor.

An additional source of heat energy, which must also be dissipated in order to minimize exchange reactions, is produced by the negative heats of formation being released as the oxide layer is forming. For example, aluminum atoms present in aluminum oxide are in a lower, more stable energy state than they are when in an uncombined, elemental form. When aluminum is combined with oxygen, energy is given off in the form of heat which must be dissipated in order to avoid exchange reactions. Since the actual chemical combination of the elements which comprise the oxide layer is actually occurring on the semiconductor surface, maintaining the substrate and the gas at $\leq 49°$ K. further promotes a reduction in the incidence of defect states by effectively dissipating these heats of formation.

The preferred embodiment of the method of the present invention also utilizes a vacuum of $\leq 10^{-9}$ Torr to control the rate of condensation of the oxygen retained on the substrate surface.

The oxidizing gas performs several functions. On one hand, it functions as a buffering layer to absorb the latent heat of condensation created during the deposition of an elemental metal, such as atomic aluminum, which provides the base material from which the corresponding oxide is formed. Secondly, the oxidizing gas provides oxygen for the formation of the oxide being formed.

Contrary to the suggestions of previous experiments, the method of the present invention includes providing a condensed film of an oxidizing gas directly on the substrate surface as well as the reactive deposition of a material, thereby resulting in the formation of the desired oxide directly on the substrate surface.

Once the oxidizing gas has been provided on the surface of the substrate, the base material of which the oxide is formed is delivered to the substrate surface where it reacts with the oxidizing gas to form the corresponding oxide. In the preferred embodiment of the present invention, atomic aluminum is delivered to a GaAs surface after molecular oxygen has been provided on the surface to dissipate the latent heat of condensation and provide a favorable oxidizing environment for producing the aluminum oxide layer.

Unlike the prior art which calls for either a sputtering of a target material containing the previously formed oxide of choice followed by the subsequent deposition of the oxide molecules on the substrate, or alternatively, the formation of the oxide vapor by chemical interaction of vapor phase reactants followed by a subsequent vapor phase deposition of the oxide vapor, the method of the present invention involves a reactive deposition wherein the oxide is actually formed at the site of deposition simultaneously with the delivery of the base material from which the corresponding oxide is formed. More specifically, the material being deposited undergoes a chemical reaction with the oxidizing gas to promote formation of an oxide directly on the substrate surface.

EXAMPLE

In the preferred embodiment of the invention, an electronic grade (100)-oriented GaAs wafer (obtained from Crystal Specialties International, Akzo Electronic Products Group, 2853 Janitell Road, Colorado Springs, Colo.) was used as a substrate. The wafer was cut and polished to within $2° \pm 0.5°$ off the (100) direction, which was normal to the wafer surface. Prior to installation in the vacuum system, the wafer was precleaned by etching in a aqueous solution consisting of sulfuric acid (95-98% A.C.S. reagent grade), hydrogen peroxide (30% solution in water, A.C.S. reagent grade) and distilled water in a ratio of 5:1:1. The etching was done in a room temperature solution for a time ranging from 30 seconds to 1 minute. This produced a mirror-like surface on the wafer. The specifics of the etching treatment can be varied to change the etching speed and surface quality. The wafer had linear dimensions of 1 cm by 1 cm, but the size could vary from 1 cm$^2$ to the 4 inch diameter or larger disk-shaped wafers normally used in electronic device fabrication.

The 1 cm$^2$ wafer was mounted on a helium cooled copper cold finger capable of reaching temperatures below 50° K. ($-223°$ C.). The copper cold finger consisted of a solid $\frac{3}{4}$ inch diameter cooper rod which was modified by drilling a perpendicular hole $\frac{1}{2}$ inch in diameter to accommodate an E-292 ceramic button heater (obtained from Spectra-Mat, Inc., 1240 Highway One, Watsonville, Calif.). The copper rod was further modified by machining a threaded stud for installing the rod on a Helitran cryostat (obtained from Air Products and Chemicals, Inc., Allentown, Pa.). The copper rod was also modified by milling a "flat" perpendicular to the hole drilled for the button heater. This flat was provided to facilitate the attachment of the planar GaAs wafer. The 1 cm$^2$ GaAs (100) wafer was attached to the cold finger using non-magnetic stainless steel clips on each corner. The button heater was inserted into the hole which was drilled in the copper cold finger in order to heat the GaAs wafer from behind. The size and configuration of the GaAs wafer processing system was dictated by the peculiar requirements of the specific vacuum system employed but could, in other cases, vary in size and construction within parameters known to practitioners in the field. Additionally, other means known in the art for heating or cooling the sample could be employed.

The cold finger was inserted through a horizontal port of the vacuum chamber and was aligned along the vertical centerline. This orientation was governed by the geometry of the evaporation sources, the gas source and the surface analytical equipment present in the vacuum chamber. However, alternative equipment set-ups could be employed to accommodate other vacuum chamber layouts. The vacuum chamber was an ultra-high vacuum chamber of standard design and consisted of a non-magnetic stainless steel vacuum enclosure equipped with a turbo-molecular pump, a cryopump and an ion pump. This system maintained a vacuum better than $1 \times 10^{-9}$ Torr during the experiment, however, a vacuum $\leq 1 \times 10^{-5}$ Torr could be acceptable.

An oxygen gas source consisting of a cylinder filled with molecular oxygen gas of research grade purity (99.998%), a gas handing manifold and a leak valve (Model No. 951-5106, obtained from Varian, Inc., Palo Alto, Calif.) was used to supply the oxidizing gas. The leak valve was directly connected to the vacuum chamber. Aluminum was deposited on the wafer using a resistively heated tungsten basket evaporation source operated using procedures well known in the art. A range of commercially available MBE evaporation sources could also be used to provide aluminum vapor for aluminum oxide growth. During the aluminum evaporation, the source was operated using power levels that gave an evaporation rate of 2 angstroms/minute.

The vacuum-based apparatus described above was used as follows to grow a relatively pure aluminum oxide layer on GaAs (100). The GaAs (100) wafer was cleaned by argon ion bombardment and annealed to restore surface composition and structure. The wafer was subsequently cooled to a temperature $\leq 49°$ K. by passing cold helium gas and liquid through the Helitran cryostat. This step typically takes from about 30 to 40 minutes and requiress several liters of liquid helium to cool the cryostat and cold finger to temperatures ranging from about 4.2° K. at the base of the cryostat to about 49° K. at the end of the copper cold finger.

The sample was heated during the cooling phase to maintain its temperature above 250° K. in order to prevent the cryopumping of impurities from the residual atmosphere in the vacuum chamber. This requires a gradual increase in the heater power as the copper cold finger becomes colder. During cooling, the residual atmospheric gases "freeze out" onto the cryostat and colder parts of the copper cold finger and the vacuum chamber pressure decreased from a pressure of about $5 \times 10^{-10}$ Torr before cool-down to about $5 \times 10^{-11}$ Torr. After cryopumping, the power was cut to the ceramic button heater and the GaAs (100) wafer rapidly underwent cooling to a temperature of $\leq 49°$ K. There was little residual gas present in the vacuum chamber atmosphere to condense on the sample and contaminate it.

After cooling the GaAs wafer to a temperature of $\leq 49°$ K., oxygen gas was admitted to the vacuum chamber and a multilayer film of molecular oxygen was deposited on the GaAs substrate. The multilayer molecular oxygen film used in this example was deposited by increasing $O_2$ partial pressure to about $1 \times 10^{-7}$ Torr for 16 minutes. The critical temperature for oxygen retention on the surface varies according to the oxygen vapor pressure. In the specific example described herein, oxygen is removed from the substrate at approximately 50° K. Consequently, there was a requirement to maintain the substrate at a temperature of $\leq 49°$ K. in order to retain a significant amount of molecular oxygen on the substrate surface.

The aluminum oxide layer was grown by depositing atomic aluminum into the oxygen layer using low-pressure aluminum vapor from the resistively heated aluminum source. The aluminum reacts on contact with the molecular oxygen and consumes the molecular gas as a reactant. The amounts of oxygen and aluminum can be controlled using techniques well known to vacuum technologists in order to produce aluminum oxide layers ranging in thickness from a few atomic layers to thousands of such layers.

Surface spectroscopic data was taken to demonstrate the efficacy of the technique described herein for producing a relatively pure aluminum oxide layer on the GaAs (100) surface. Thermal stability of the resulting oxide layer was demonstrated by heating the aluminum oxide covered GaAs (100) wafer to temperatures of $\geq 573°$ K. (300° C.). No appreciable change in the surface spectroscopic data was observed. Heating at higher temperatures (>650° K.) leads to the destruction of the GaAs (100) substrate.

CONCLUSIONS AND SUMMARY OF DATA

In the preferred embodiment of the method of the present invention, valence band and core level photoelectron energy distribution curves were obtained to study the formation of the interface created between the substrate and the oxide layer. In particular, FIGS. 1-4 have been provided to illustrate whether the condensed oxygen retained on the surface of the GaAs (100) substrate promotes an unacceptable level of GaAs (100) oxidation, whether the physiosorbed oxygen protects the GaAs (100) from undergoing exchange reactions with the free aluminum being delivered to the substrate surface prior to the formation of an aluminum oxide and whether the resulting aluminum oxide overlayer is substantially clean, uniform and free from other undesirable metal-oxygen species.

The data illustrated in FIGS. 1-4 shows that the condensation of oxygen on the surface of the GaAs (100) does not result in appreciable levels of oxidation of the substrate. Additionally, the Figures show that a stable metal oxide forms upon the reactive deposition of free aluminum, yielding a high quality oxide film that is free from the exchange reactions which characterize the substrate/oxide layer interface when free aluminum is deposited directly on a GaAs substrate without the presence of an oxygen layer retained on the substrate surface.

The experiments supporting the data present in FIGS. 1-4 were carried out at the National Synchrotron Light Source of the Brookhaven National Laboratory in Upton, N.Y., using beamline U7b ($15 \leq n\nu \leq 160$ eV). Photoelectron energy analysis was done using a Leybold 100 mm hemispherical analyzer.

In FIG. 1, several valence band energy distribution curves are shown to illustrate the formation of aluminum oxide on a GaAs (100) surface at various successive stages. In particular, energy distribution curves (a-d) have been rescaled to comparable heights for visual clarity and show valence band energies for GaAs (100) under various conditions.

Curve (a) represents the characteristic binding energy for the valence electrons of GaAs (100) prior to any exposure to molecular oxygen of free aluminum. The valence band maximum (VBM) was found to be 0.42 eV below the Fermi level, indicating the sputter-annealed surface is pinned.

Curve (b) represents the characteristic binding energy for the valence electrons of GaAs (100) after exposure to 100 Langmuirs of oxygen at 49° K. Additionally, curve (b) illustrates the presence of physiosorbed molecular oxygen denoted by the four peaks which have been designated in the Figure as the $O_2$ $3\delta_g$(BE=13.6 eV), $3\delta_g$(BE=11.2 eV), $1\pi_\mu$(BE=9.8eV), and $1\pi g$(BE=5.2eV) orbitals. These peaks correlate with the binding energy for the valence electrons of the physiosorbed molecular oxygen. Comparing curve (a) with curve (b), the presence of physiosorbed molecular oxygen in curve (b) can be observed and is indicative of the $O_2$ layer present on the substrate surface.

Curve (c) represents the characteristic binding energy for the valence electrons of GaAs (100) after 10 angstroms of aluminum have been deposited. The absence of the $O_2$ peaks which were present in curve (b) is a result of the free aluminum reacting with the physiosorbed molecular oxygen to create aluminum oxide, It can be further noted that a new peak is present in curve (c) at $\approx 6.0$ eV and correlates with the presence of the aluminum oxide layer formed on the substrate surface. This peak represents the binding energy for the valence electrons of aluminum oxide.

Curve (d) represents a 100 Langmuir oxygen exposure of a 25 angstrom aluminum film at room temperature, which is similar to that seen in bulk aluminum oxidation studies.

In summary, FIG. 1 is presented to demonstrate that molecular oxygen was indeed deposited on the substrate surface and subsequently combined with aluminum to form aluminum oxide.

Figure 2:
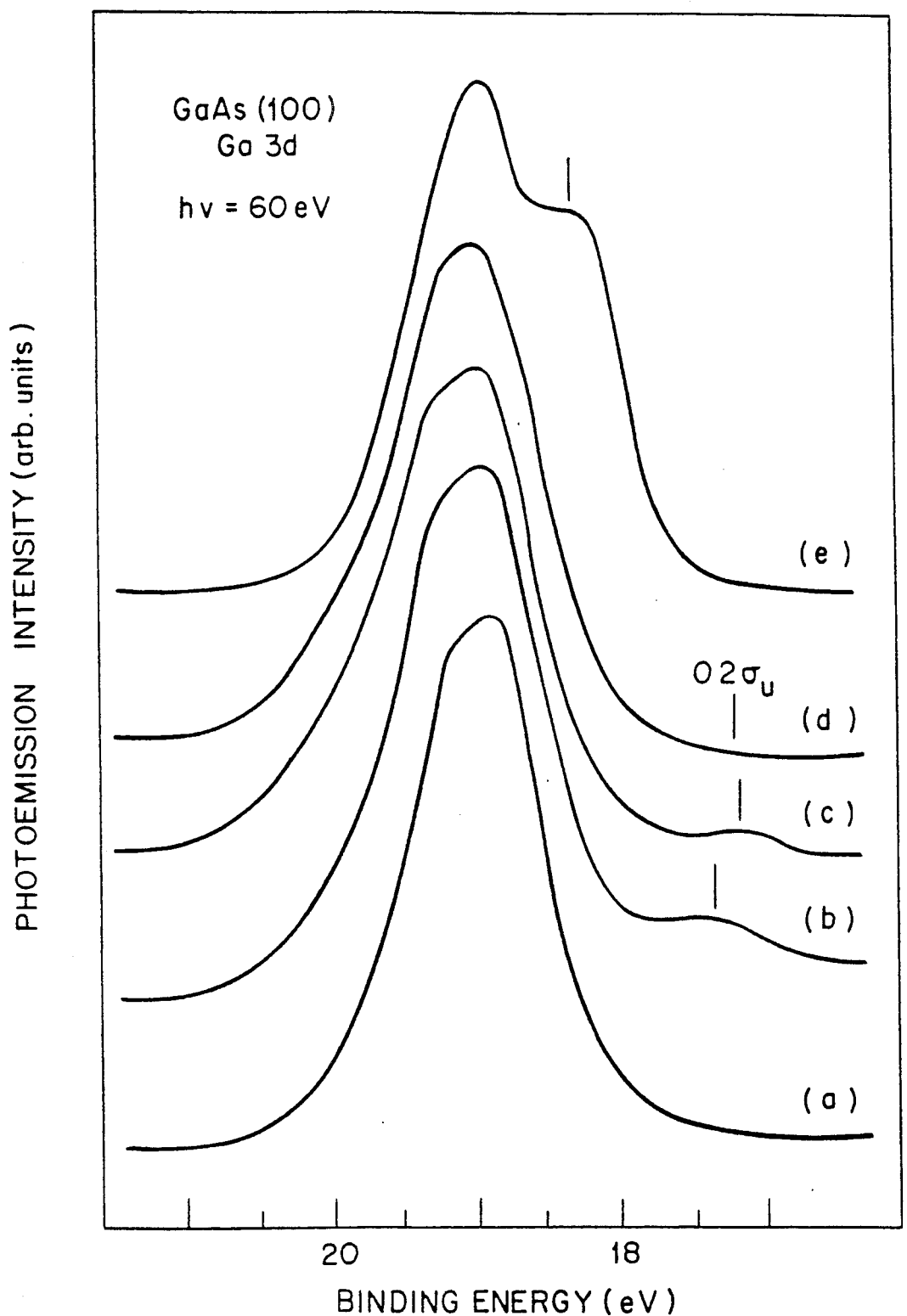
FIG. 2 shows various energy distribution curves corresponding with the binding energies associated with the 3d core level electrons of the "Ga" component of GaAs (100), taken at various succesive stages of alumimum oxide formation.

FIG. 2 has been provided as it contains the most relevant data in terms of illustrating whether the method of the present invention substantially reduces substrate disruption. In particular, FIG. 2 illustrates the energy distribution curves for the 3d core level electrons of the "Ga" component of the semiconductor substrate, GaAs (100), taken at various successive stages of aluminum oxide formation on the substrate surface. Curves (a–e) have been rescaled to the same height for visual clarity and rigid shifts for curve (e), $-0.4$ eV, and curve (d), $-0.26$ eV, have been introduced to cancel the Fermi level movements.

Curve (a) represents the energy distribution curve corresponding with the binding energies associated with the 3d core level electrons of Ga prior to the exposure of the substrate to $O_2$ or free aluminum.

Curve (b) represents the energy distribution curve corresponding with the binding energies associated with the 3d core level electrons of Ga at 49° K. after 100 Langmuirs of $O_2$ have been deposited on the substrate surface.

Curve (c) represents the energy distribution curve corresponding with the binding energies associated with the 3d core level electrons of Ga at 49° K. after 2 angstroms of free aluminum have been deposited on the substrate surface.

Curve (d) represents the energy distribution curve corresponding with the binding energies associated with the 3d core level electrons of Ga at 49° K. after 10 angstroms of free aluminum have been deposited on the substrate surface.

In a comparison of curves (a)–(d), a small hump-like peak is observable in curves (b) and (c) at 17.4 eV which corresponds to a $O_2 2\delta_\mu$ peak. The presence of this peak in curves (b) and (c) indicates the presence of physiosorbed molecular oxygen. It is noteworthy that this peak persists after 2 angstroms of free aluminum have been deposited (see curve c) but is not observable after 10 angstroms of aluminum have been deposited (see curve d). Such an observation indicates that the first 2 angstroms of aluminum do not consume all of the molecular oxygen and that oxidation continues until all of the molecular oxygen is exhausted.

Curve (e) represents the energy distribution curve corresponding with the binding energies associated with the 3d core level electrons of Ga for a 10 angstrom aluminum deposition of GaAs (100) at room temperature without any molecular oxygen retained as a film on the substrate surface. A substitutional interface or exchange reaction involving the formation of an undesirable Ga-Al species is indicated on curve (e) by a shifted Ga 3d component having a $\Delta BE \approx -1$ eV.

Comparing curves (e) to curves (b)–(d) indicates that the deposition of free aluminum on the substrate surface by the method of the present invention does not cause the Ga-Al exchange reaction, thereby yielding a high quality oxide layer free from defect states.

Figure 3:
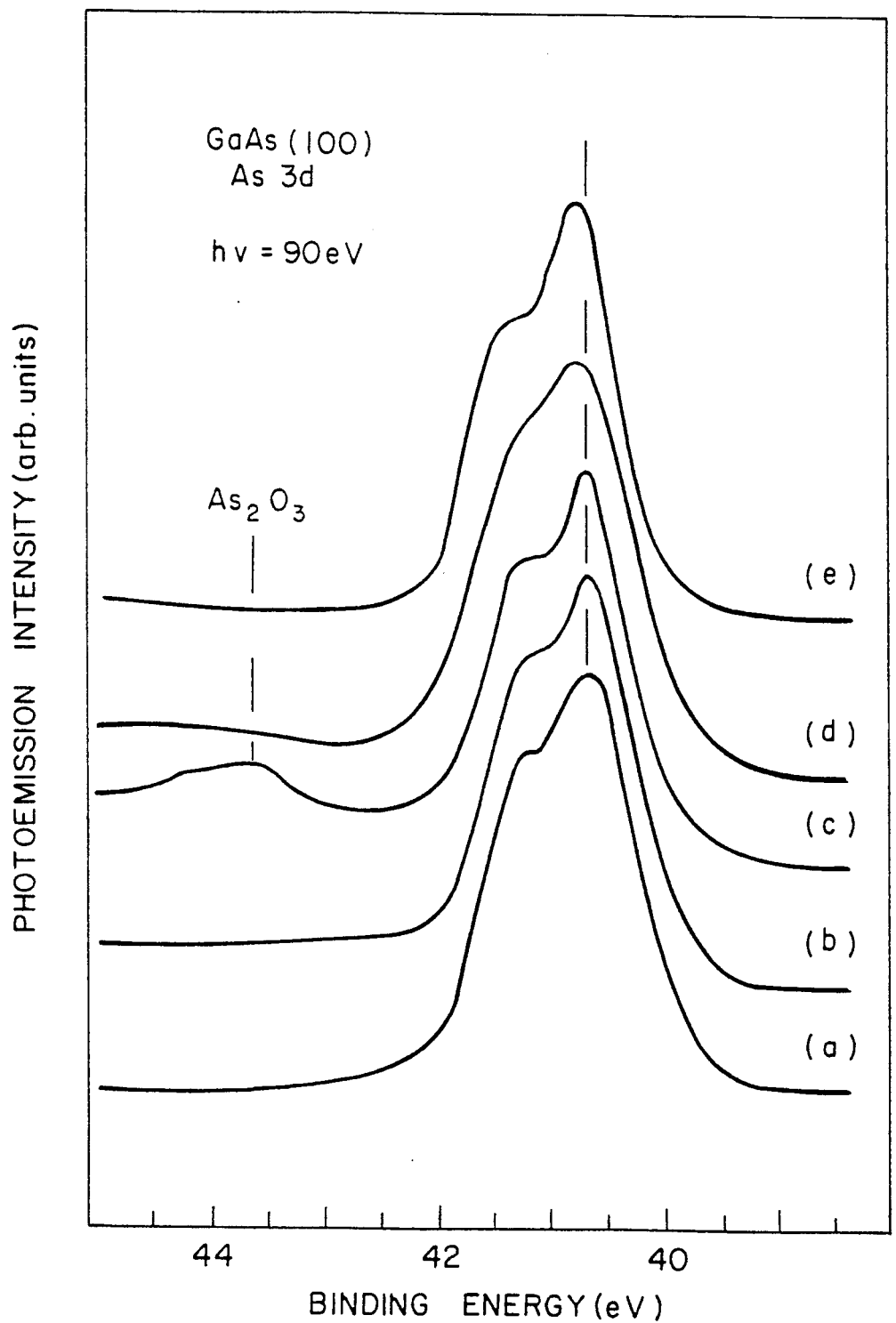
FIG. 3 shows various energy distribution curves corresponding with binding energies associated with the 3d core level electrons of the "As" component of GaAs (100), taken at various stages of aluminum oxide formation.

FIG. 3 illustrates various energy distribution curves corresponding with the binding energies associated with the 3d core level electrons of the "As" component of the semiconductor substrate, GaAs (100), taken at various successive stages of aluminum oxide formation.

In particular, curve (a) represents the characteristic energy distribution curve corresponding with the binding energies associated with the 3d core level electrons of As when present in the form of GaAs (100), prior to any exposure to oxygen or free aluminum.

Curve (b) corresponds to data taken after the substrate surface has been exposed to 100 Langmuirs of $O_2$ at 49° K. The similarity between curves (a) and (b) indicates that there has been no disruption of the substrate surface with respect to As upon exposure to $O_2$. If the As component of the GaAs (100) had reacted with $O_2$, an additional peak would have been observed.

Curve (c) represents the characteristic binding energies associated with the 3d core electrons of As present in GaAs (100) at 49° K. after having received condensed $O_2$ on its surface and after having received the deposition of 2 angstroms of free aluminum. A discernible peak appears at $\Delta BE = 3.1$ eV which corresponds to an As oxide intermediate.

Upon examination of curve (d), which correlates to data taken after 10 angstroms of aluminum were deposited, it is apparent that the additional As oxide peak appearing in curve (c) has disappeared upon the deposition of additional aluminum, indicating that the formation of As oxide is intermediary.

Curve (e) represents the energy distribution curve corresponding with the binding energies associated with the 3d core level electrons of As when present in the form of GaAs (100), after 10 angstroms of aluminum was directly deposited on the substrate surface at room temperature. Surprisingly, there is no disruption of the substrate under normal room temperature conditions, as indicated by the similarity between curves (e) and (a). Thus, from the data gathered from the standpoint of As 3d core level electron binding energies, it would appear that there is no substrate disruption under any conditions. Taken alone, FIG. 3 might indicate there is no advantage in the present invention for providing a better method for depositing an oxide layer on a semiconductor surface under low temperatures. However, the data present in FIG. 2 is based only on the energy distribution curves for the 3d core level electrons of As and is not conclusive as to the effectiveness of the present invention, especially in light of the fact that it is the "Ga" component of GaAs which tends to undergo the problematic exchange reactions previously discussed.

Figure 4:
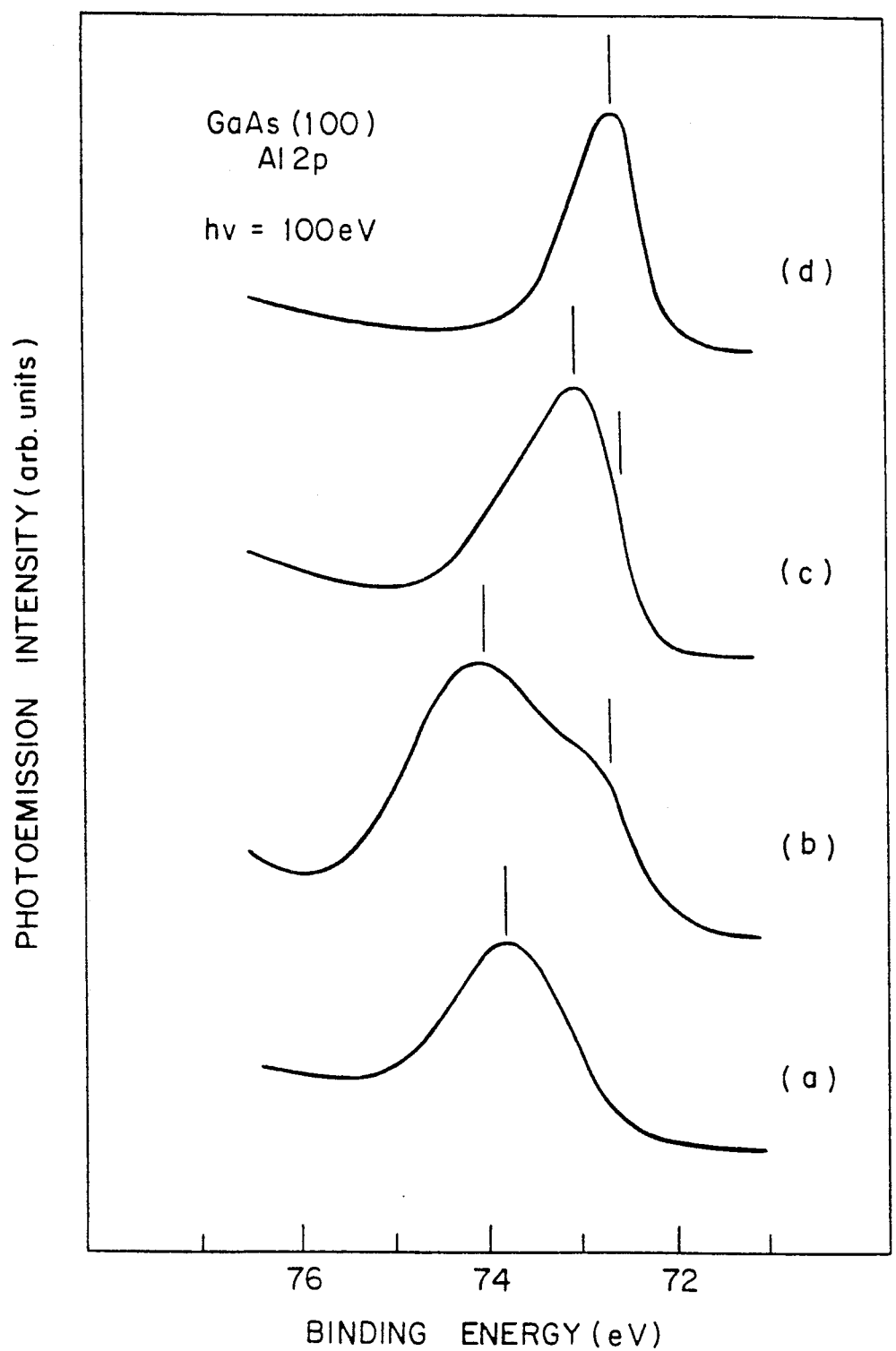
FIG. 4 shows various energy distribution curves corresponding with the binding energies associated with the 2p core level electrons of aluminum that has been deposited on a GaAs (100) surface under various conditions.

Finally, FIG. 4 has been provided to demonstrate that the resulting oxide layer is uniformly composed of aluminum oxide, free from any metallic aluminum. In particular, FIG. 4 illustrates the characteristic binding energies for the 2p core level electrons of aluminum that has been deposited on a GaAs (100) surface in the presence of a solid layer of molecular oxygen in order to induce aluminum oxide growth.

Curve (a) of FIG. 4 represents the energy distribution curve corresponding with the binding energy of the 2p core level electrons of aluminum after the deposition of two angstroms of free aluminum on a GaAs (100) surface which has received 100 Langmuirs of $O_2$ at a temperature of 49° K. Curve (a) contains a peak corresponding to an Al-O component having a chemical shift of $\approx 1.5$ eV that suggests that the Al-O environment is aluminum rich compared to $Al_2O_3$ or the surface Al-O phase seen during the early stage of polycrystalline aluminum oxidation.

Curve (b) represents the energy distribution curve corresponding with the binding energies associated with the 2p core level electrons after 10 angstroms of aluminum have been deposited. A shoulder appears on the Al-O peak indicating the presence of metallic aluminum. The appearance of this shoulder at $BE = 72.6$ eV coincides with the disappearance of the $O_2\ 2\delta_\mu$ feature seen in curve (d) of FIG. 2, indicating that all of the molecular oxygen has been consumed. Additionally, it can be observed that the deposition of 10 angstroms of aluminum also removes oxygen from the $As_2O_3$ component appearing in curve (d) of FIG. 3.

Curve (c) represents the energy distribution curve corresponding with the binding energies associated with the 2p core level electrons of aluminum for aluminum deposited on a GaAs (100) surface at room temperature. Only a peak corresponding with metallic aluminum and a broadening of that peak due to the presence of an unresolved Ga-Al component are observed. It should be noted that the metallic aluminum 2p position (BE=72.9 eV), after the deposition of 10 angstroms of aluminum, is not exactly equal to the bulk aluminum 2p value. However, after 25 angstroms of aluminum have been deposited, the aluminum 2p peak position moves to 72.4 eV. This is the same peak position as seen when a thick film of aluminum is deposited on a substrate surface (see, for example, curve d).

Curve (d) represents the energy distribution curve corresponding with the binding energies associated with the 2p core level electrons of aluminum after aluminum has been deposited as a thick film (>30 angstroms) on a tantalum substrate.

In comparing curves (a-d) of FIG. 4, it is apparent that the deposited aluminum reacts completely with molecular oxygen to form an aluminum oxide before all the molecular oxygen is exhausted and forms a complete oxide layer with no trace of metallic aluminum.

In conclusion, the data shows that the condensation of oxygen does not cause oxidation of the underlying substrate, that a stable metal oxide forms upon metal deposition and that the condensed oxygen suppresses the Ga-Al substitutional interface reaction which occurs when aluminum is deposited directly on a GaAs surface.

While there have been described what are presently believed to be the preferred embodiments of the invention, those skilled in the art will realize that changes and modifications may be made thereto without departing from the spirit of the invention, and it is intended to claim all such changes and modifications as fall within the true scope of the invention.

We claim:

1. a method for providing an oxide film of a material on a substrate surface comprising:
    providing a solid or liquid layer of a substance which is an oxidizing gas at room temperature on said substrate surface in an amount sufficient to promote formation of an oxide of said material upon said substrate surface at a pressure of less than or equal to $10^{-5}$ Torr and temperatures less than or equal to 49° K.; and
    reactively depositing said material onto said substrate surface in the presence of said layer of said oxidizing gas.

2. The method of claim 1, wherein said substrate surface comprises a semiconducting substance.

3. The method of claim 1, wherein said material is an elemental metal.

4. The method of claim 2, wherein said semiconducting substance is a compound semiconductor.

5. The method of claim 4, wherein said compound semiconductor is composed of elements selected from the group consisting of periodic Group IIB elements, periodic Group IIIA elements, periodic Group IVA elements, periodic Group VA elements and periodic Group VIA elements.

6. The method of claim 4, wherein said compound semiconductor is composed of elements selected from the group consisting of periodic Group IIIA elements, periodic Group IVA elements and periodic Group VA elements.

7. The method of claim 4, wherein said compound semiconductor is composed of gallium arsenide.

8. The method of claim 3, wherein said elemental metal is selected from the group consisting of titanium, tungsten, aluminum and zirconium.

9. The method of claim 3, wherein said elemental metal is aluminum.

10. The method of claim 1, wherein said oxidizing gas is molecular oxygen.

* * * * *